United States Patent
Alkemade et al.

(10) Patent No.: US 9,759,775 B2
(45) Date of Patent: Sep. 12, 2017

(54) METHOD FOR MONITORING A BATTERY, EVALUATION DEVICE, AND MEASURING SYSTEM

(71) Applicant: Robert Bosch GmbH, Stuttgart (DE)

(72) Inventors: Ulrich Alkemade, Leonberg (DE); Jake (John) Christensen, Elk Grove, CA (US); Bernd Schumann, Rutesheim (DE)

(73) Assignee: Robert Bosch GMBH, Stuttgart (DE)

( * ) Notice: Subject to any disclaimer, the term of this patent is extended or adjusted under 35 U.S.C. 154(b) by 0 days.

(21) Appl. No.: 15/106,093

(22) PCT Filed: Dec. 2, 2014

(86) PCT No.: PCT/EP2014/076167
§ 371 (c)(1),
(2) Date: Jun. 17, 2016

(87) PCT Pub. No.: WO2015/090926
PCT Pub. Date: Jun. 25, 2015

(65) Prior Publication Data
US 2016/0320455 A1    Nov. 3, 2016

(30) Foreign Application Priority Data
Dec. 19, 2013 (DE) .................. 10 2013 226 696

(51) Int. Cl.
*G01R 15/20* (2006.01)
*G01R 31/36* (2006.01)
*H01M 10/48* (2006.01)

(52) U.S. Cl.
CPC ......... *G01R 31/3606* (2013.01); *G01R 15/20* (2013.01); *G01R 31/3658* (2013.01); *H01M 10/482* (2013.01); *H01M 2220/20* (2013.01)

(58) Field of Classification Search
CPC .................................................. G01R 31/3606
(Continued)

(56) References Cited

U.S. PATENT DOCUMENTS 4,422,166 A * 12/1983 Klein .................... G01S 15/025
340/850
5,250,903 A * 10/1993 Limuti ................ H01M 10/484
324/204

(Continued)

FOREIGN PATENT DOCUMENTS

| DE | 102009000225 | 7/2010 |
|----|----|----|
| JP | 2011-522262 A | 7/2011 |
| KR | 10 2011 0123758 A | 11/2011 |

OTHER PUBLICATIONS

International Search Report dated Mar. 17, 2015, of the corresponding International Application PCT/EP2014/076167, filed on Dec. 2, 2014.

*Primary Examiner* — Drew A Dunn
*Assistant Examiner* — Jerry D Robbins
(74) *Attorney, Agent, or Firm* — Norton Rose Fulbright US LLP; Gerard Messina

(57) ABSTRACT

A method for monitoring a first battery in a device, in particular in a motor vehicle, a first magnetometer measuring a magnetic flux density in the battery and/or adjacent to the battery, a second magnetometer measuring a magnetic flux density remotely from the first battery in the device, and in a period, in which no power supply or power withdrawal is provided to or from the first battery, a measurement of the first and the second magnetometer being carried out, and an evaluation unit, for the case in which the magnetic flux density measured by the first magnetometer exceeds a background magnetic flux density measured with the aid of (Continued)

the second magnetometer beyond a predetermined amount, determining and outputting an error status of the first battery.

10 Claims, 3 Drawing Sheets

(58) Field of Classification Search
USPC .......................................................... 324/426
See application file for complete search history.

(56) References Cited

U.S. PATENT DOCUMENTS

| 5,537,042 | A | * | 7/1996 | Beutler | G01R 27/02 |
| | | | | | 324/234 |
| 7,928,690 | B2 | * | 4/2011 | Koch | G01R 31/3606 |
| | | | | | 320/107 |
| 8,125,214 | B1 | | 2/2012 | Steingart et al. | |
| 8,198,864 | B2 | * | 6/2012 | Koch | G01R 31/3648 |
| | | | | | 320/132 |
| 9,086,460 | B2 | | 7/2015 | Rice et al. | |
| 9,217,782 | B2 | * | 12/2015 | Bertrand | G01R 15/207 |
| 2005/0218001 | A1 | * | 10/2005 | You | C25B 15/02 |
| | | | | | 205/89 |
| 2006/0186859 | A1 | | 8/2006 | Masato et al. | |
| 2011/0074432 | A1 | | 3/2011 | Tinnemeyer | |

\* cited by examiner

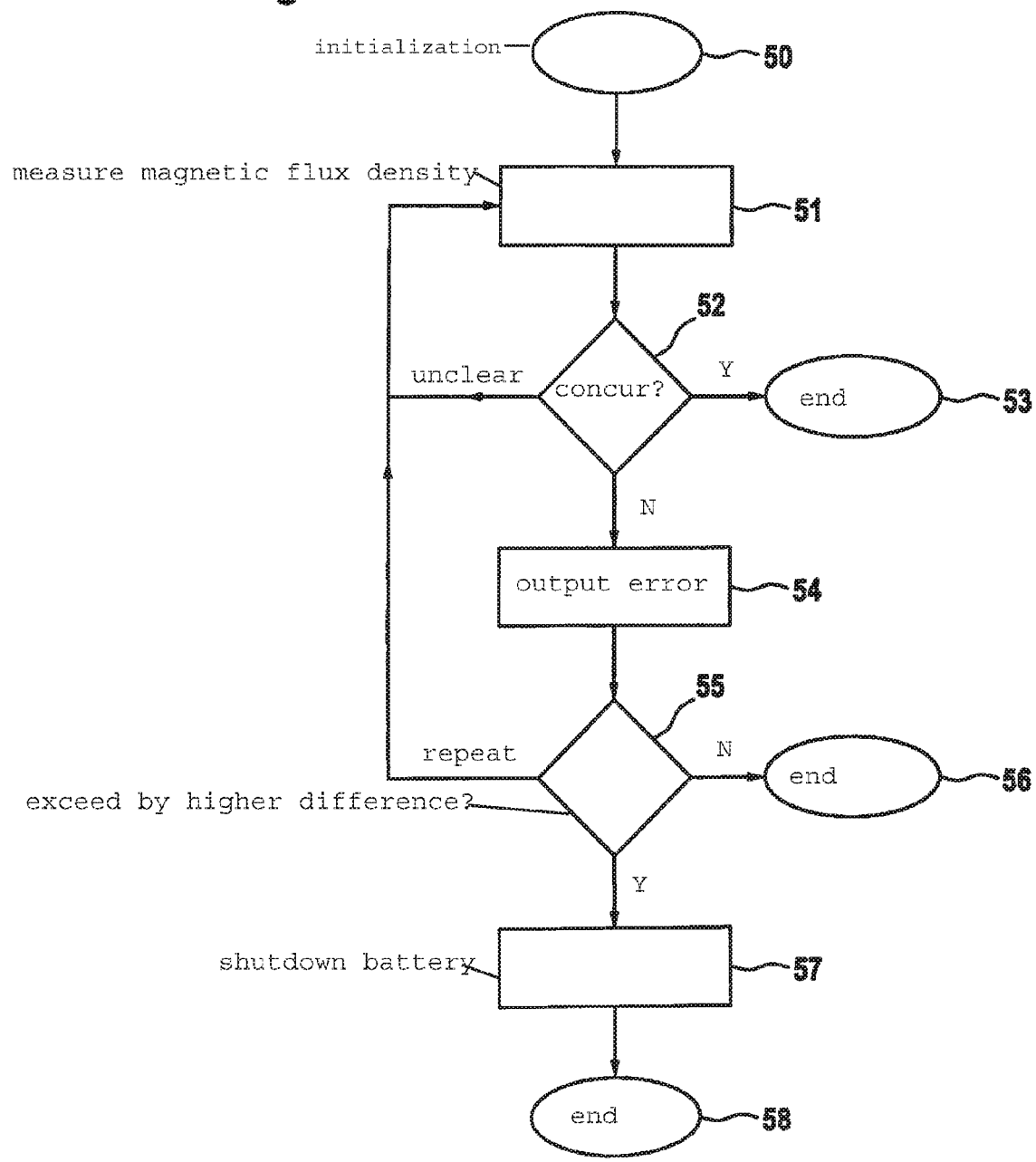

METHOD FOR MONITORING A BATTERY, EVALUATION DEVICE, AND MEASURING SYSTEM

BACKGROUND INFORMATION

The present invention is directed to a method for monitoring a battery, an evaluation device provided for this purpose, and a measuring system including such an evaluation device. A battery having an integrated current sensor is described in German Patent Application No. DE 10 2009 000 225 A1. The current sensor is situated on a load circuit of the battery, at least the current sensor being integrated into a housing of the battery and contacts an electronic evaluation circuit via measuring lines. The current sensor may be designed, for example, as a magnetic field sensor. The current emitted by the battery may be measured thereby. It is thus possible, for example, in the event of a short-circuit of a device connected to the battery, to measure an increased current flow and to initiate suitable countermeasures.

SUMMARY

A battery is understood hereafter as a set of batteries or cells, which are connected in parallel and/or in series. A single cell is referred to hereafter as a battery, battery cell, or cell.

Since the present invention may be applied to a bundled set of cells and also to single cells, the description below is to include both cases here.

An example method according to the present invention may have the advantage that an internal short-circuit of a battery may be determined in a simple way. An internal short-circuit of a battery exists if additional currents flow directly between the electrodes in the interior of the battery cell, without this current flowing through the load connected to a battery, and an internal discharge of the battery thus occurs. Such internal short-circuits are undesirable, since the battery is discharged in this way, on the one hand, and the battery may heat up and may be damaged by a heat development which is induced by the current flow, on the other hand. Such internal short-circuits may be triggered, for example, by interfering metal or carbon particles, which connect electrodes inside the cell. Furthermore, such short-circuits in the interior of the cell may also be caused by a high level of heat action on the battery. A crack in a separator between two electrodes may also enable this short-circuit.

In the method according to the present invention for monitoring a battery in a device, a first magnetometer is provided, which measures a magnetic flux density in the battery or directly adjacent to the battery. The magnetic field which is caused by a procedure in the interior of the cell may also still be detected outside a housing in the immediate vicinity. Furthermore, a second magnetometer is situated remotely from the first battery in such a way that a magnetic flux in the first battery cannot impair the second magnetometer. In a period in which no power supply to or power withdrawal from the first battery is provided, a measurement of the magnetic flux is carried out using the first magnetometer and the second magnetometer. In this case, both magnetometers are only to measure a magnetic flux which is caused by interfering variables such as the Earth's magnetic field or magnetic elements or elements through which current flows in the vicinity of the device. The magnetic flux which is measured by both magnetometers is therefore to be approximately equal. However, if an interior short-circuit occurs in the first battery, the currents which flow inside the first battery also cause a magnetic field. This magnetic field will be measured by the first magnetometer, but not by the second magnetometer. A deviation of the magnetic flux therefore occurs between the first magnetometer and the second magnetometer. If this deviation exceeds a predefined amount, it may thus be determined that there is an internal short-circuit of the first battery. Suitable measures may therefore be taken. On the one hand, a warning may be output to a user of the device. Furthermore, it is also possible that the first battery is shut down, so that the temperature in the battery is not increased still further by an external power withdrawal. Furthermore, suitable cooling measures may also be initiated for cooling the first battery. An operation of the battery in the first device is therefore made safer. A reliable statement about an internal short-circuit in the first battery may be made in a simple way by the measurement using the two magnetometers.

Advantageous refinements of and improvements on the example method are possible. It may be advantageous if the second magnetometer repeatedly carries out a measurement of the magnetic flux density, so that an average value is ascertained for a background flux density and also in particular this value is ascertained for a specific driving route or the location of the vehicle. A more accurate value for a background magnetic field is thus available, so that a statement may be made more reliably about a deviation from this background magnetic field.

Furthermore, it may be advantageous if the measurement of the background magnetic flux density using the second magnetometer is carried out simultaneously with a measurement using the first magnetometer, to be able to subtract a time variation of the magnetic field caused by external influences from the measured values and therefore be able to exclude such interfering influences. A signaling evaluation of magnetic field data of both magnetometers in the time and frequency domains is also advantageous, to be able to identify typical industrial sources of interference due to, for example, high-power current alternating fields due to transformers or overhead wire lines of rail vehicles, for example.

Corresponding advantages result for an example evaluation device according to the present invention for monitoring a first battery, which has interfaces to a first magnetometer, to a second magnetometer, and to an output unit for outputting an error message.

Furthermore, corresponding advantages result for an example measuring system according to the present invention, which has two corresponding magnetometers in addition to the evaluation device.

It may be particularly advantageous to design the magnetometers as Hall sensors, GMR sensors, or SQID sensors, since these sensors may be operated cost-effectively and reliably. In this case, in one particular specific embodiment, the magnetic field sensors may also be situated in the interior of the electrochemical cell or the electrode coil.

Furthermore, it may be advantageous to provide a magnetic flux concentrator device on at least one of the magnetometers, to be able to amplify a magnetic field accordingly and preclude interfering influences.

Furthermore, it may be advantageous to attach a magnetic shielding device in such a way that an overload of the magnetometer may be prevented, for example, a permanent change by way of an excessively strong influence of a magnetic field. This is helpful in particular if a high magnetic flux density, which arises due to a power withdrawal from the battery, is to be shielded from the magnetometer.

Furthermore, it may be advantageous to situate the second magnetometer on a second battery. It is thus possible, for the case in which an error only occurs in one battery of two batteries, to determine an internal short-circuit in the first battery with the aid of the first magnetometer, while the magnetometer situated on the second battery is used as a reference signal generator. Furthermore, with such a system it is also possible to determine an internal short-circuit in the second battery using the second magnetometer situated on the second battery, while the first magnetometer situated on the first battery is used as the reference signal generator for this measurement. A corresponding measuring system may be scaled up to a plurality of batteries. A further magnetometer may also be provided remotely from the battery as a magnetometer for measuring the background magnetic flux density. However, it is also possible that one of the other, adjacent magnetometers, which are situated directly on a battery, is used for measuring the background magnetic flux density.

Moreover, it may also be advantageous to operate multiple magnetometers as the first magnetometer and situate them on a battery, preferably on various lateral surfaces. It is hereby possible to be able to better detect disturbances which may occur at various points in the battery.

It may also be advantageous to shield external magnetic fields, which are not associated with the battery or the battery cell, by way of a plate which covers the entire battery.

If the magnetic field and a short-circuit malfunction, which is possibly stronger, are also to be measured in a system during operation of the battery, this field may be subtracted, by a model-controlled evaluation method with assistance of the battery current data and cell geometries, from the magnetometer signal of both magnetometers with the aid of values modeled for the location and a measurement of at least stronger short-circuits may thus be enabled.

BRIEF DESCRIPTION OF THE DRAWINGS

Exemplary embodiments of the present invention are shown in the figures and are explained in greater detail below.

FIG. 4 shows an exemplary embodiment of a sequence of the method according to the present invention.

DETAILED DESCRIPTION OF EXAMPLE EMBODIMENTS

The present invention may be used for batteries in arbitrary devices. A use for motor vehicles is advantageous in particular, since in this case a desire for a longer durability of the batteries, a higher need for safety for the operation of such a device, and quite robust usage conditions, such as high temperatures and strong shocks, are brought together. The device in which the batteries are situated may therefore be a motor vehicle, for example.

Figure 1:
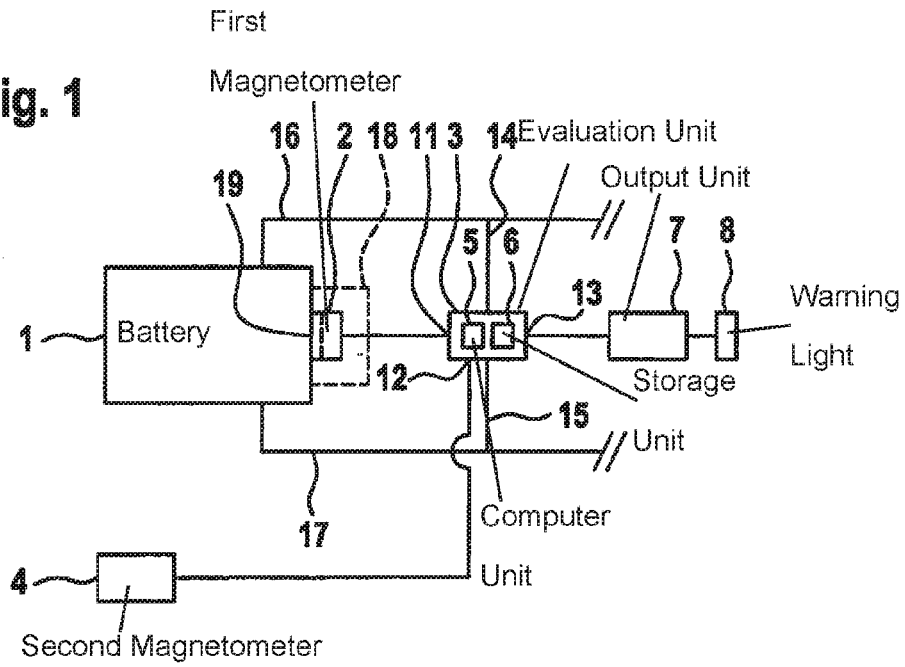
FIG. 1 shows a first exemplary embodiment of a measuring system according to the present invention including an evaluation device according to the present invention.

FIG. 1 shows a first exemplary embodiment for monitoring a single battery 1. At the battery, a magnetometer 2 is situated on an outer side of the battery. The shell of the battery is preferably made of a nonmagnetic material or of a nonconductive material, for example, plastic. Currents flowing in the interior of the battery may therefore be detected easily by the magnetometer. The magnetometer supplies its measuring results to an evaluation unit 3. In a first specific embodiment, first magnetometer 2 only supplies an absolute value of the measured magnetic flux density. However, it is also possible in another specific embodiment that a piece of vector information about the direction of the magnetic flux and the amplitude are measured and transmitted to evaluation unit 3. In a first specific embodiment, first magnetometer 2 may supply these pieces of information continuously. In another specific embodiment, it is also possible that evaluation unit 3 initiates a corresponding measurement.

First magnetometer 2 is connected via a first interface 11 to evaluation unit 3. A second magnetometer 4 is connected to evaluation unit 3 at a second interface 12. Second magnetometer 4 is preferably configured structurally equivalent to the first magnetometer. Second magnetometer 4 is situated in the device, i.e., for example, in a motor vehicle, in such a way that a disturbance of electrical currents which flow inside battery 1 may be precluded or nearly precluded.

Evaluation unit 3 has a computer unit 5, which evaluates the measured magnetic flux densities of magnetometers 2, 4. In another specific embodiment, it is possible that the measuring results are stored for further evaluation in a storage unit 6 in evaluation unit 3. For example, it is possible that a background flux density is determined by averaging via averaging of the flux densities measured by second magnetometer 4. A frequency analysis coupled with a vector formation may also be carried out, to thus identify a passing interference source. The magnetic flux densities are compared by evaluation unit 3 with respect to their amplitude and/or their alignment. If it is shown that a deviation is determined, evaluation unit 3 thus accesses an output unit 7 via a third interface 13. For example, a warning light 8 may be connected to output unit 7, which warns a user of the device, i.e., for example, a driver of the vehicle, about an internal short-circuit in battery 1. Furthermore, output unit 7 may also activate further systems, for example, an electrical regulating unit for battery 1 or a cooling system of battery 1.

A measurement of the magnetic flux densities is preferably carried out using magnetometers 2, 4 when battery 1 is not being charged and is also not being discharged. For this purpose, the evaluation unit accesses the two poles 16, 17 of battery 1 via terminals 14, 15 and carries out a voltage and current measurement. If it is determined that the battery is not absorbing or emitting power, a measurement of the magnetic flux density is thus carried out by means of magnetometers 2, 4 in this period. In one specific embodiment, the measurement is carried out at the same time. Furthermore, however, it is also possible to carry out a comparison of a measuring result of first magnetometer 2 with an averaged result of second magnetometer 4. Furthermore, the measuring results of both magnetometers may also be averaged over a longer period.

In another specific embodiment, the first magnetometer may be protected by a protection device 18 for protection from an excessively high magnetic flux. Protection device 18 is formed from Monel, for example.

In another specific embodiment, a magnetic flux concentrator device 19 may be provided, for example, made of iron, nickel, or an alloy having such a geometric structure that the magnetic flux lines from the short-circuit are conducted better to first magnetometer 2. In particular, flux concentrator 19 may be adapted to the winding direction of the electrode coils located in the interior of the cell and their geometry.

Furthermore, it is also possible that analog or digital filter units and frequency analyzers are provided in evaluation unit 3, to filter variations of the magnetic field from the surroundings out of the measuring signal.

Figure 2:
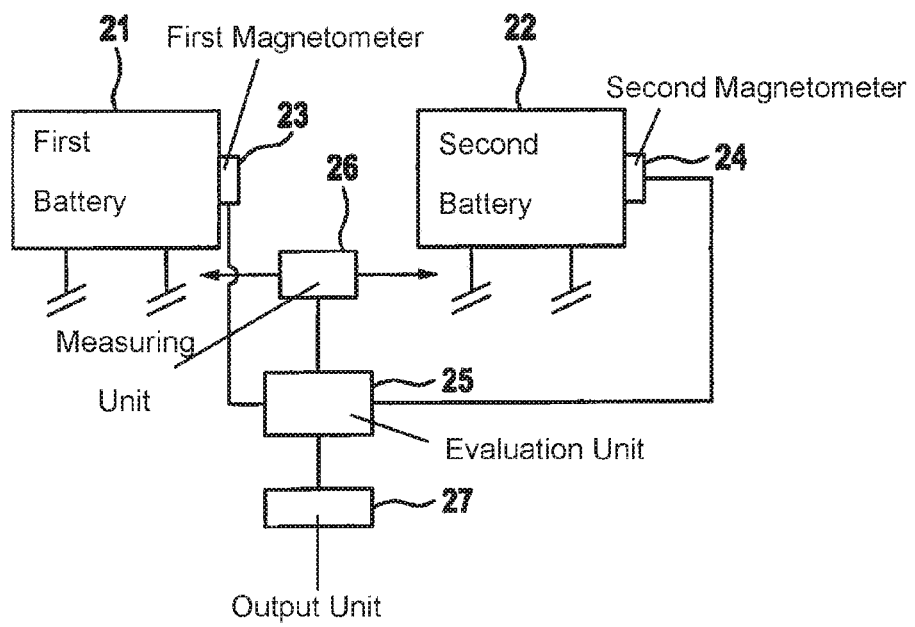
FIG. 2 shows a second exemplary embodiment of a measuring system according to the present invention including an evaluation device according to the present invention.

Another exemplary embodiment is shown in FIG. 2. In this case, a first battery 21 and a second battery 22 are provided. A first magnetometer 23 is situated on first battery 21 and a second magnetometer 24 is situated on second battery 22. Both magnetometers 23, 24 are connected to an evaluation unit 25, which measures the magnetic flux densities in batteries 21, 22. To monitor the operation of batteries 21, 22, evaluation unit 25 is provided with a corresponding measuring unit 26 for measuring an operation of batteries 21, 22, i.e., in particular for measuring an applied voltage and a current which is emitted by the batteries. Evaluation unit 25 is connected to an output unit 27. If the two batteries are not in charging or discharging operation, magnetometers 23, 24 should thus solely measure a background magnetic field. However, if there is an internal short-circuit in one of batteries 21, 22, the associated magnetometer will thus measure a significantly higher flux density. This is determined by evaluation unit 25, so that it may output an error message to output unit 27.

Figure 3:
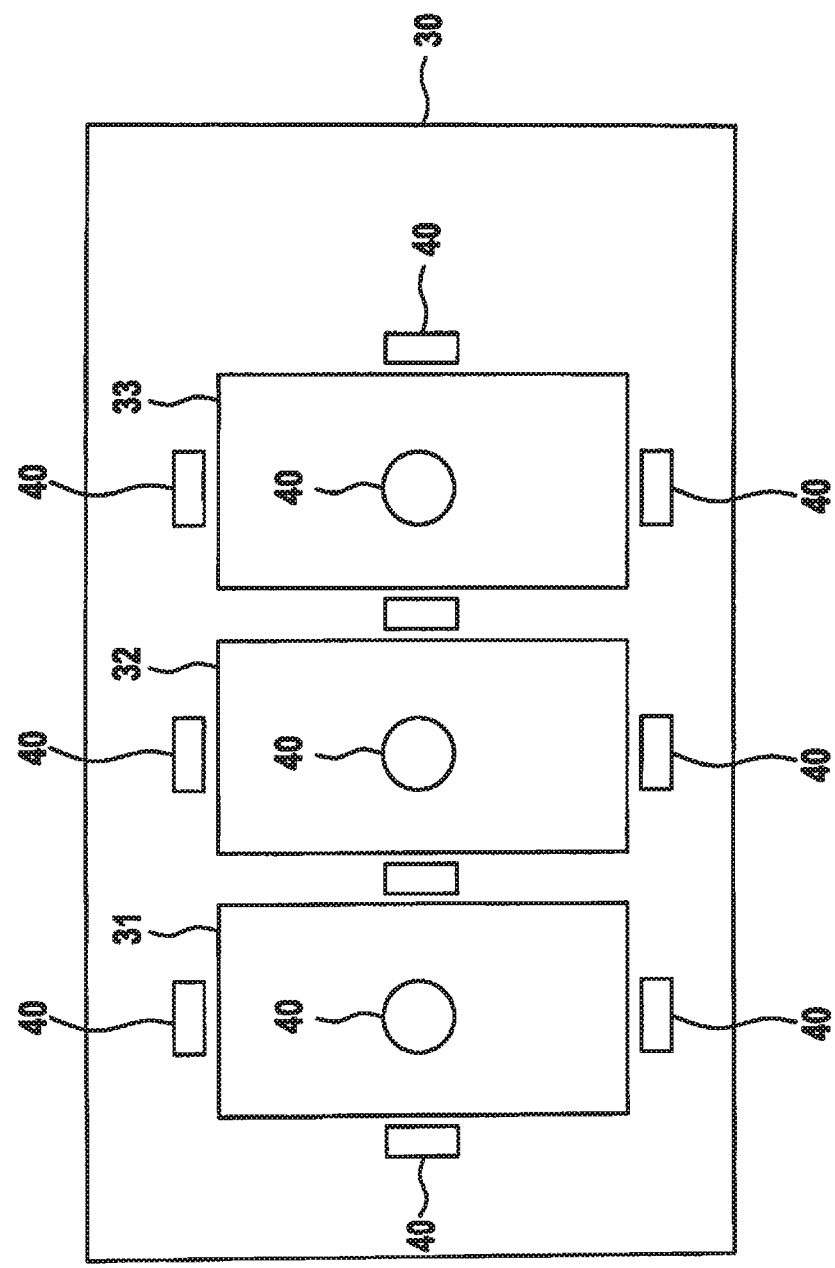
FIG. 3 shows another exemplary embodiment including an arrangement of magnetometers on a plurality of batteries.

FIG. 3 shows an exemplary embodiment in which three batteries 31, 32, 33 are situated in a device 30. Magnetometers 40, which measure the magnetic flux density for the associated battery in each case, are situated on all sides of batteries 31, 32, 33. Magnetometers are situated between the batteries, which may determine the magnetic flux density from at least two batteries. A reference magnetometer is preferably provided outside battery module 30, which determines a background magnetic flux density.

FIG. 4 shows an example of a method sequence according to the present invention. The method is initiated by an initialization step 50. Such a measurement may be carried out according to predefined time intervals. However, it may also be triggered by a diagnostic program.

A magnetic flux density is measured by the at least two magnetometers in a measuring step 51. In a subsequent evaluation step 52, it is determined whether the measuring results of the two magnetometers essentially concur or deviate from one another beyond a predefined amount. If the measuring result is unclear, the sequence thus branches back to first measuring step 51. If the measuring results essentially concur, an internal short-circuit of the battery is thus to be excluded and the method is ended with an ending step 53. If the measuring results deviate from one another beyond a predefined amount, the sequence thus branches to an error step 54. A deviation is determined and output accordingly to an output unit in error step 54. In a second evaluation step 55, it is subsequently checked whether the deviation additionally exceeds a second, higher difference absolute value. If this is not the case, the method is thus ended in an ending step 56. An error is processed further by the output unit. For a repetition of the measuring method, the sequence may optionally also branch back to first measuring step 51. However, if a specific limit is exceeded beyond a predefined amount, the sequence branches further to a shutdown step 57, in which the battery is shut down. The method is subsequently ended in an ending step 58.

What is claimed is:

1. A method for monitoring, by an evaluation device, a first battery in a device, comprising:

measuring, by a first magnetometer, a magnetic flux density at least one of in the battery and adjacent to the battery;

measuring, with the aid of a second magnetometer, a magnetic flux density remotely from the first battery in the device; and in a period in which no power supply or power withdrawal is provided to or from the first battery, carrying out a measurement by the first and the second magnetometer, the evaluation unit, for the case in which the magnetic flux density measured by the first magnetometer exceeds a background magnetic flux density measured using the second magnetometer beyond a predetermined amount, determining and outputting an error status of the first battery.

2. The method as recited in claim 1, wherein the device is a motor vehicle.

3. The method as recited in claim 1, wherein the second magnetometer repeatedly carries out a measurement of the magnetic flux density, and the evaluation unit is configured to determine an average value for the background magnetic flux density, and the average value is used for a comparison to the magnetic flux density measured by the first magnetometer.

4. The method as recited in claim 1, wherein the background magnetic flux density is determined by a measurement using the second magnetometer simultaneously with a measurement using the first magnetometer.

5. An evaluation unit for monitoring a first battery in a device, comprising:

a first interface for connecting a first magnetometer for measuring a magnetic flux density at least one of: i) in the first battery, or ii) adjacent to the first battery;

a second interface for connecting a second magnetometer, the second magnetometer being situated remotely from the first battery in the device; and a third interface for activating an output unit to output an error message for the monitored first battery for the case in which the evaluation unit, in a period in which no power supply or power withdrawal is provided to or from the first battery, receives a result of a measurement of the magnetic flux density from the first magnetometer and the second magnetometer and the magnetic flux density measured by the first magnetometer exceeding beyond a predetermined amount a background magnetic flux density measured with the aid of the second magnetometer.

6. A measuring system, comprising:

at least one magnetometer situated on the first battery, for measuring a magnetic flux density at least one of in or adjacent to the first battery;

a further magnetometer situated remotely from the first battery in the device; and an evaluation unit for monitoring the first battery in the device, the evaluation unit including a first interface for connecting the first magnetometer, a second interface for connecting a second magnetometer, and a third interface for activating an output unit to output an error message for the monitored first battery for the case in which the evaluation unit, in a period in which no power supply or power withdrawal is provided to or from the first battery, receives a result of a measurement of the magnetic flux density from the first magnetometer and the second magnetometer and the magnetic flux density measured by the first magnetometer exceeding beyond a predetermined amount a background magnetic flux density measured with the aid of the second magnetometer.

7. The measuring system as recited in claim 6, wherein the at least one magnetometer and the further magnetometers are at least one of: Hall sensors, GMR sensors, and SQID sensors.

8. The measuring system as recited in claim 6, further comprising:
a magnetic flux concentrator unit.

9. The measuring system as recited in claim 6, further comprising:
a magnetic shielding unit for limiting the magnetic flux density through at least one magnetometer during a load withdrawal from the first battery.

10. The measuring system as recited in claim 6, wherein the second magnetometer is situated on a second battery.

* * * * *